United States Patent
Lan et al.

(10) Patent No.: US 7,935,590 B2
(45) Date of Patent: May 3, 2011

(54) METHOD OF MANUFACTURING METAL OXIDE SEMICONDUCTOR AND COMPLEMENTARY METAL OXIDE SEMICONDUCTOR

(75) Inventors: Bang-Chiang Lan, Taipei (TW); Chen-Hua Tsai, Hsin-Chu Hsien (TW); Yu-Hsin Lin, Tai-Nan (TW); Tsung-Lung Tsai, Tai-Nan (TW); Cheng-Tzung Tsai, Taipei (TW)

(73) Assignee: United Microelectronics Corp., Science-Based Industrial Park, Hsin-Chu (TW)

( * ) Notice: Subject to any disclaimer, the term of this patent is extended or adjusted under 35 U.S.C. 154(b) by 0 days.

(21) Appl. No.: 11/382,916

(22) Filed: May 11, 2006

(65) Prior Publication Data

US 2007/0264765 A1 Nov. 15, 2007

(51) Int. Cl.
*H01L 21/8238* (2006.01)
(52) U.S. Cl. ........ 438/199; 438/230; 438/231; 438/300; 257/E21.431; 257/E21.634
(58) Field of Classification Search .................. 438/300, 438/199, 230, 231; 257/E21.431, E21.634
See application file for complete search history.

(56) References Cited

U.S. PATENT DOCUMENTS

| | | | | |
|---|---|---|---|---|
| 4,998,150 A * | 3/1991 | Rodder et al. | ................ | 257/288 |
| 5,102,816 A * | 4/1992 | Manukonda et al. | ......... | 438/231 |
| 5,198,378 A * | 3/1993 | Rodder et al. | ................ | 438/297 |
| 5,200,352 A * | 4/1993 | Pfiester | ........................ | 257/344 |
| 5,434,093 A * | 7/1995 | Chau et al. | .................... | 438/300 |
| 5,710,450 A * | 1/1998 | Chau et al. | .................... | 257/344 |
| 6,100,013 A * | 8/2000 | Brown et al. | ................. | 430/312 |
| 6,821,836 B2 * | 11/2004 | Juengling | .................... | 438/230 |
| 6,960,785 B2 | 11/2005 | Jin | | |
| 6,989,322 B2 * | 1/2006 | Gluschenkov et al. | ........ | 438/585 |
| 7,018,891 B2 * | 3/2006 | Doris et al. | .................... | 438/243 |
| 7,566,609 B2 * | 7/2009 | Luo et al. | ...................... | 438/222 |
| 2005/0093084 A1 | 5/2005 | Wang | | |

FOREIGN PATENT DOCUMENTS

CN 1670964 A 9/2005

\* cited by examiner

*Primary Examiner* — Matthew C Landau
*Assistant Examiner* — Vicki B Booker
(74) *Attorney, Agent, or Firm* — Winston Hsu; Scott Margo

(57) ABSTRACT

A method of manufacturing a metal oxide semiconductor is provided. The method includes forming an offset spacer and a disposable spacer around the offset spacer. Then, forming a plurality of epitaxial layers outside the disposable spacer and removing the disposable spacer. In addition, the method includes forming a plurality of source/drain extension areas in the substrate outside the offset spacer and the epitaxial layers. Because the source/drain extension areas are formed after the selective epitaxial growth process, the thermal of the selective epitaxial growth process does not damage the source/drain extension areas.

11 Claims, 12 Drawing Sheets

METHOD OF MANUFACTURING METAL OXIDE SEMICONDUCTOR AND COMPLEMENTARY METAL OXIDE SEMICONDUCTOR

BACKGROUND OF THE INVENTION

1. Field of the Invention

The present invention relates to a method of manufacturing a metal oxide semiconductor transistor and a complementary metal oxide semiconductor transistor, an more particularly, to a method of manufacturing a metal oxide semiconductor transistor and a complementary metal oxide semiconductor transistor, which forms source/drain extension areas before forming epitaxial layers.

2. Description of the Prior Art

Since the sizes of semiconductor components get smaller and smaller, the processes of manufacturing the transistors have improved greatly in forming small size and high quality transistors.

The method of manufacturing the prior transistor involves first forming a gate, and then a low thermal budget ion implanting process is used to form source and drain extension areas (also called lightly doped drain, LDD) in the silicon substrate and on the two sides of the gate. A spacer is formed besides the gate, and the gate and the spacer serve as a mask for another ion implanting process, so as to form the source/drain. A plurality of contact plugs are formed in order to electrically connect the gate, the source, and the drain of the transistor. The surfaces of the gate and source/drain are formed with silicide by the self-aligned suicide process to improve the Ohmic contact among the gate and the source/drain.

However, the metal in the metal layer expands into the silicon substrate and consumes the silicon in the source/drain in the self-aligned silicide process. The original crystal lattice of the source/drain is damaged, and the PN junction between the source/drain and the silicon substrate is too narrow, so as to generate leakage. The components lose efficacy in the ultra shallow junction (USL).

A better solution is utilizing the selective epitaxial growth (SEG) process to stand the source/drain high, so that the silicide and the silicon substrate don't contact directly, and the source/drain extension areas are maintained. But, the temperature of the SEG process is 690 to 790 centigrade, which causes the source/drain extension areas to be damaged. So, researching methods of manufacturing the source/drain extension areas and the epitaxial layers at the same time is important.

SUMMARY OF THE INVENTION

The present invention relates to a method of manufacturing a MOS to solve the above-mentioned problems.

The present invention provides a method of manufacturing a metal oxide semiconductor. It provides a substrate, and a gate is formed on the substrate. An offset spacer is formed around the gate, and a disposable spacer is formed around the offset spacer. Then, a plurality of epitaxial layers is formed outside the disposable spacer and on the two sides of the gate. And then, the disposable spacer is removed, and a plurality of source/drain extension areas are formed in the substrate outside the offset spacer and the epitaxial layers.

The present invention provides a method of manufacturing a complementary metal oxide semiconductor transistor. A substrate is formed. A first gate, and a second gate are formed on the substrate. A first offset spacer is formed around the first gate, and a second offset spacer is formed around the second gate. A disposable spacer is formed around the second offset spacer. A plurality of epitaxial layers are formed on two sides of the second gate. The epitaxial layers are formed outside the disposable spacers. The disposable spacers are removed. And, a plurality of first source/drain extension areas are formed in the substrate and on two sides of the first gate. A plurality of second source/drain extension areas are formed in the substrate and on two sides of the second and second gate.

The present invention provides a method of manufacturing a complementary metal oxide semiconductor transistor. A substrate is formed. A first gate, and a second gate are formed on the substrate. A first and second offset spacer is formed around the first and second gate. Next, a first and second disposable spacers are formed around the first and second offset spacers. A plurality of epitaxial layers are formed on two sides of the first and second gate. The epitaxial layers are formed outside the first and second disposable spacers. The first and second disposable spacers are removed. And, a plurality of first and second source/drain extension areas are formed in the substrate and on two sides of the first and second gates.

The source/drain extension areas of the present invention are made after the SEG process, so the high temperature of the SEG process doesn't damage the source/drain extension areas. The transistor made by the present invention has an ultra shallow junction and the epitaxial layer. The silicide and the substrate of the present invention don't contact each other, and the source/drain extension areas can be maintained.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
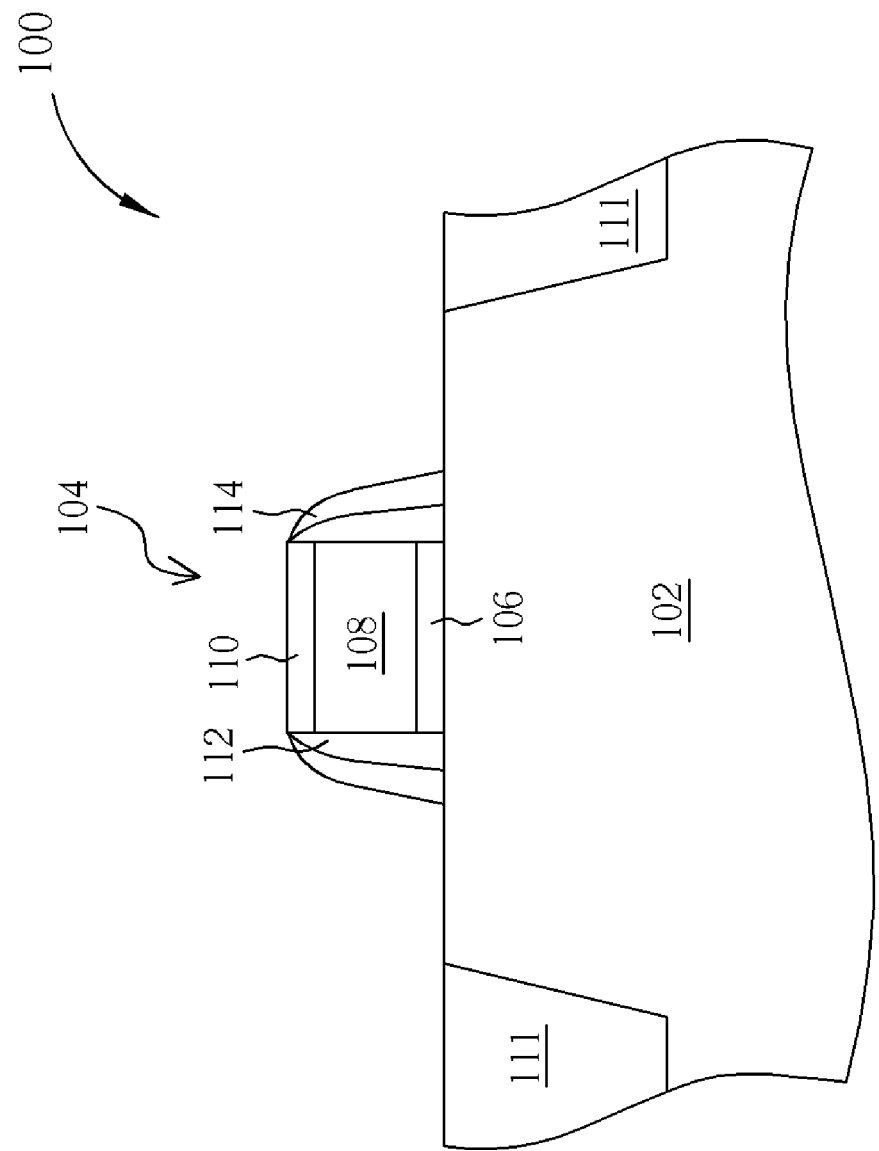
FIGS. 1 to 4 are schematic diagrams of a manufacturing method of a first embodiment in the present invention.

Please refer to FIGS. 1 to 4. FIGS. 1 to 4 are schematic diagrams of a manufacturing method of a first embodiment in the present invention. A semiconductor wafer 100 has a substrate 102, a gate, and a shallow trench isolation (STI) 111 around the gate 104. The gate 104 includes a gate insulating layer 106, a doped poly-silicon layer 108, and a cap layer 110.

And then, a deposition process and an anisotropic etching process are performed to form an offset spacer 112 around the gate 104. A nitride silicon layer (not shown) is deposited on the substrate 102 and the gate 104. An anisotropic etching process is performed to form a disposable spacer 114 around the offset spacer 112.

Figure 2:
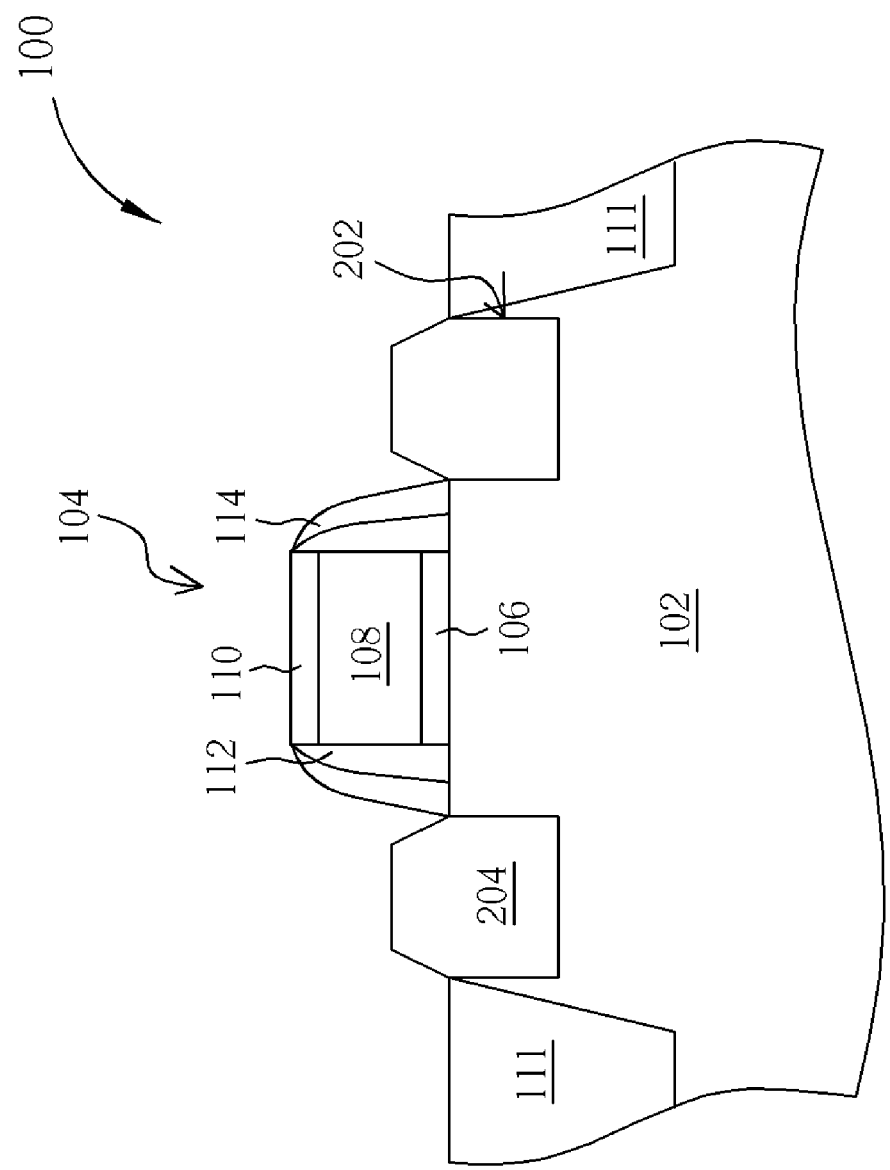
Figure 3:
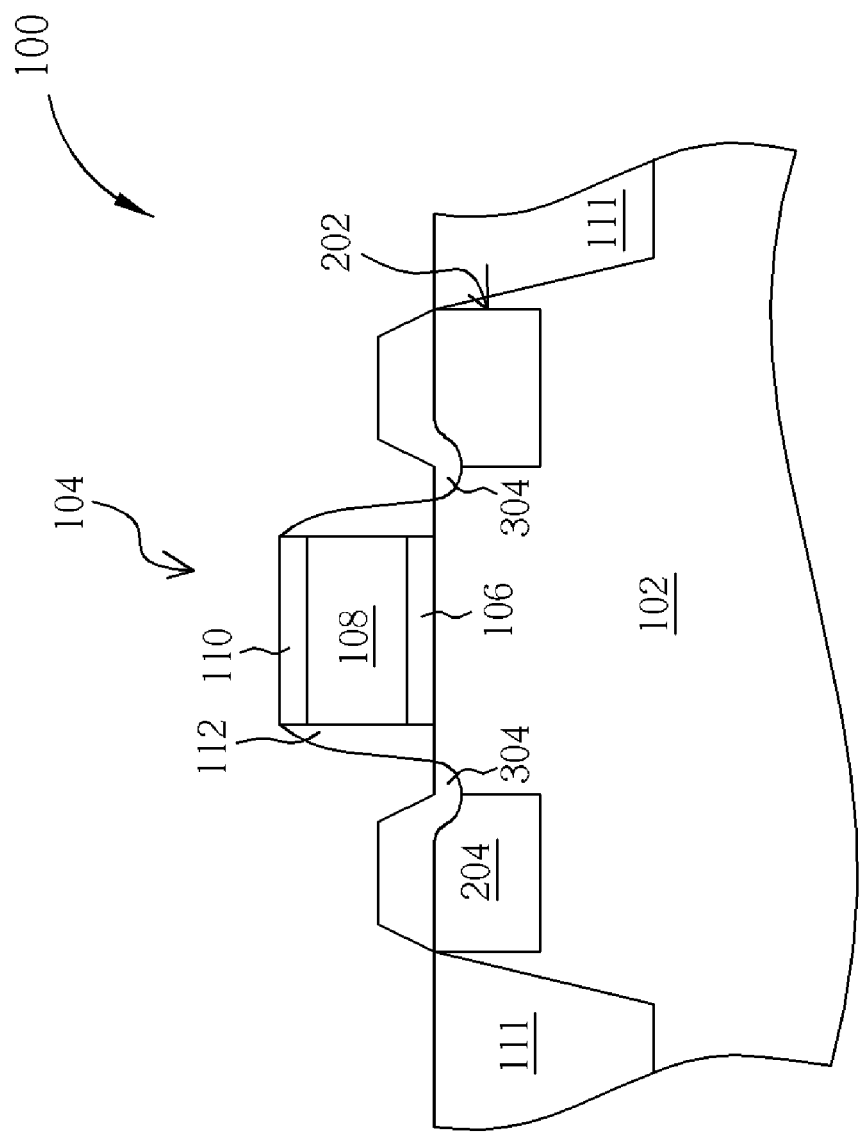

Please refer to FIG. 2. An etching process is performed and the cap layer 110 of the gate 104 and the disposable spacer 114 serve as etching masks, so as to form recesses 202 in the substrate 102 of the two side of the gate 104. And then, a selective epitaxial growth (SEG) process is performed to form epitaxial layers 204 in the recesses 202. The epitaxial layers 204 are made from silicon, SiGe or SiC. Then, the disposable spacer 114 is removed. A light dopant ion implanting process and the laser anneal process are performed to form source/drain extension areas 304 in the substrate 102 of the two sides of the offset spacer 112 and the surface of the epitaxial layer 204.

Figure 4:
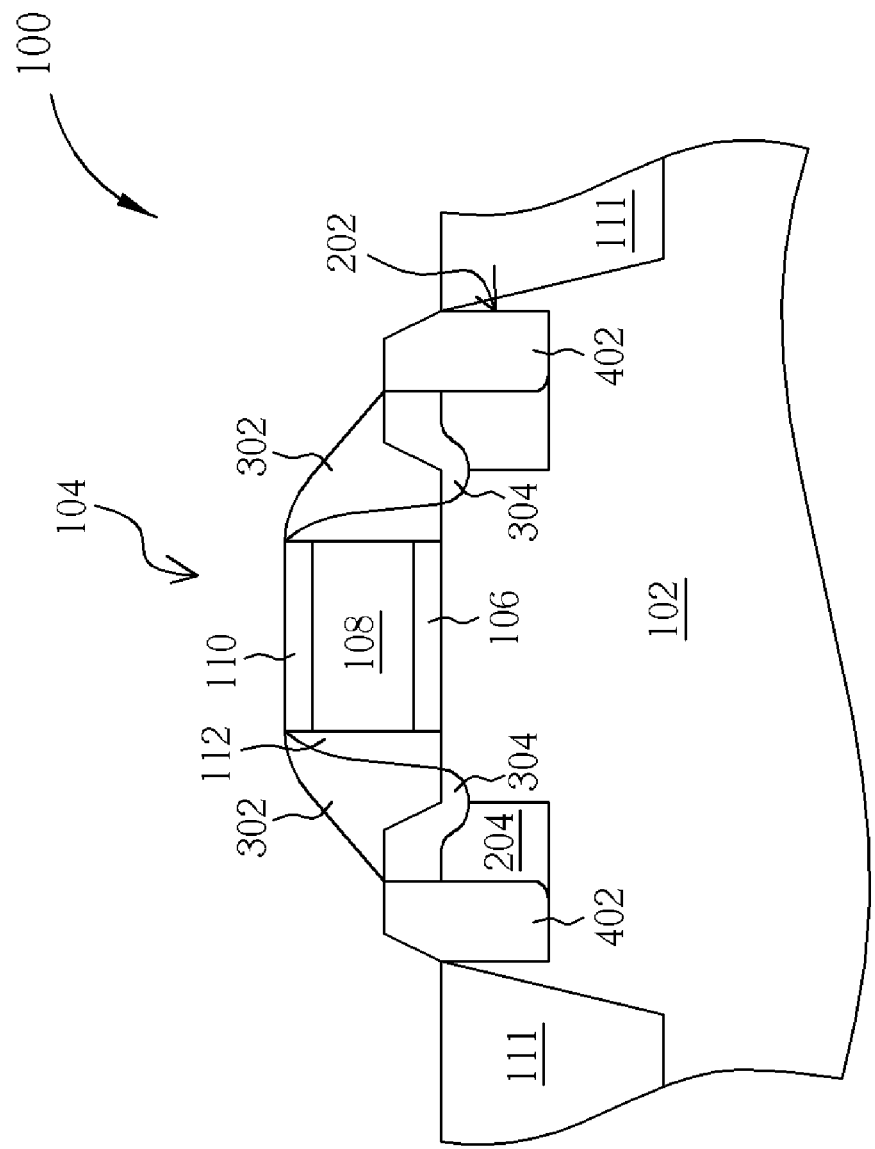
Figure 5:
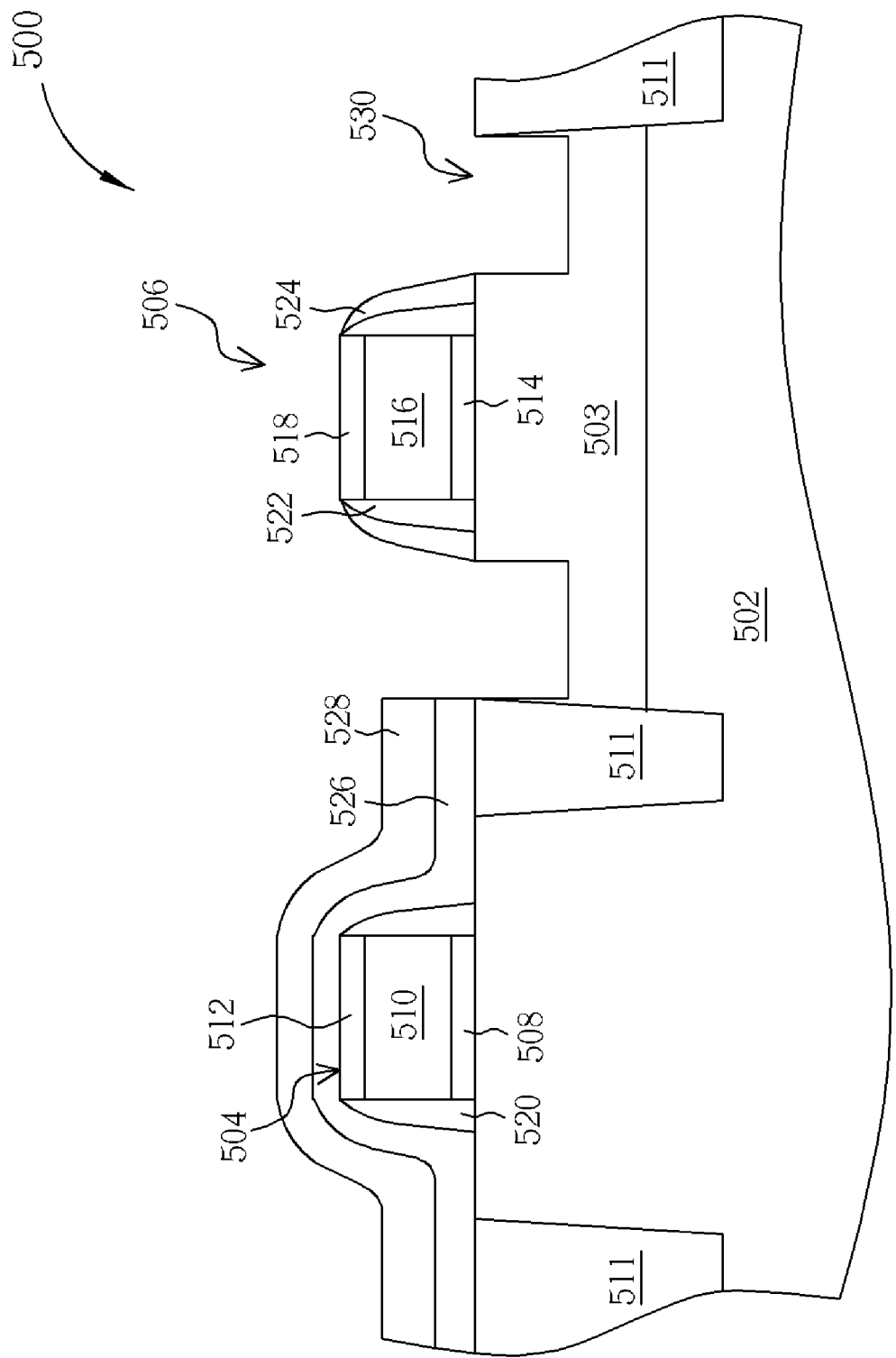
FIGS. 5 to 8 are schematic diagrams of a manufacturing method of a second embodiment in the present invention.

Please refer to FIG. 4. A nitride silicon layer (not shown) is on the gate 104, the offset spacer 112, the epitaxial layer 204, and the substrate 102. An anisotropic etching process is performed to form a main spacer 302 around the offset spacer 112. Then, the cap layer 110 and the main spacer 302 serve as the ion implanting mask, and an ion implanting process and a laser anneal process are performed, so as to form source/drain 402 in the epitaxial layer 204 outside the main spacer 302. Furthermore, a self-aligned silicide process is performed to form silicide (not shown) on the gate 104, and the source/drain 402. The gate 104 and the source/drain 402 are complete the metal oxide semiconductor (MOS) transistor.

The first embodiment is not limited to the above method of manufacturing the source/drain 402. It also can add dopant in the SEG process, so that the epitaxial layer 204 having dopant can be the source/drain directly. In the other way, the epitaxial layer 204 still has no dopant in the SEG process, but an ion implanting process is performed to form the doped epitaxial layer 204 as source/drain before the disposable spacer 114 is removed. As this is well known in the art and thus omitted here.

Please refer to FIGS. 5 to 8. FIGS. 5 to 8 are schematic diagrams of a manufacturing method of a second embodiment in the present invention. A semiconductor wafer 500 has a substrate 502. The substrate 502 has a doped well 503. The doped well 503 is an N type well in the second embodiment. Gates 504, 506 are formed on the substrate 502, and a STI 511 is around the gates 504, 506, wherein the gate 506 is on the doped well 503. The gates 504, 506 include gate insulating layers 508, 514, doped poly-silicon layers 510, 516, and cap layers 512, 518.

A nitride silicon deposition process and an anisotropic etching process are performed to form an offset spacer 520 around the gate 504. And then, a deposition process and an anisotropic etching process are performed to form an offset spacer 522 around the gate 506. The offset spacer 522 is not made from the nitride silicon, but made from dielectric material. A nitride silicon layer 526 is deposited on the substrate 502 and the gates 504, 506. A pattern hard mask 528 (for example, a pattern photoresist layer) is formed on the nitride silicon layer 526. The pattern hard mask 528 is on the gate 504 and partial substrate 502. Next, an anisotropic etching process is performed on the nitride silicon layer 526, and the pattern hard mask 528 is the etching mask, so as to form a disposable spacer 524 around the offset spacer 522 of the gate 526. Subsequently, an etching process is performed and the pattern hard mask 528, the cap layer 518 of the gate 506 and the disposable spacer 524 serve as etching masks, so as to form recesses 530 in the substrate 502 of the two side of the gate 506. After the recesses 530 are formed, the pattern hard mask 528 is removed.

Figure 6:
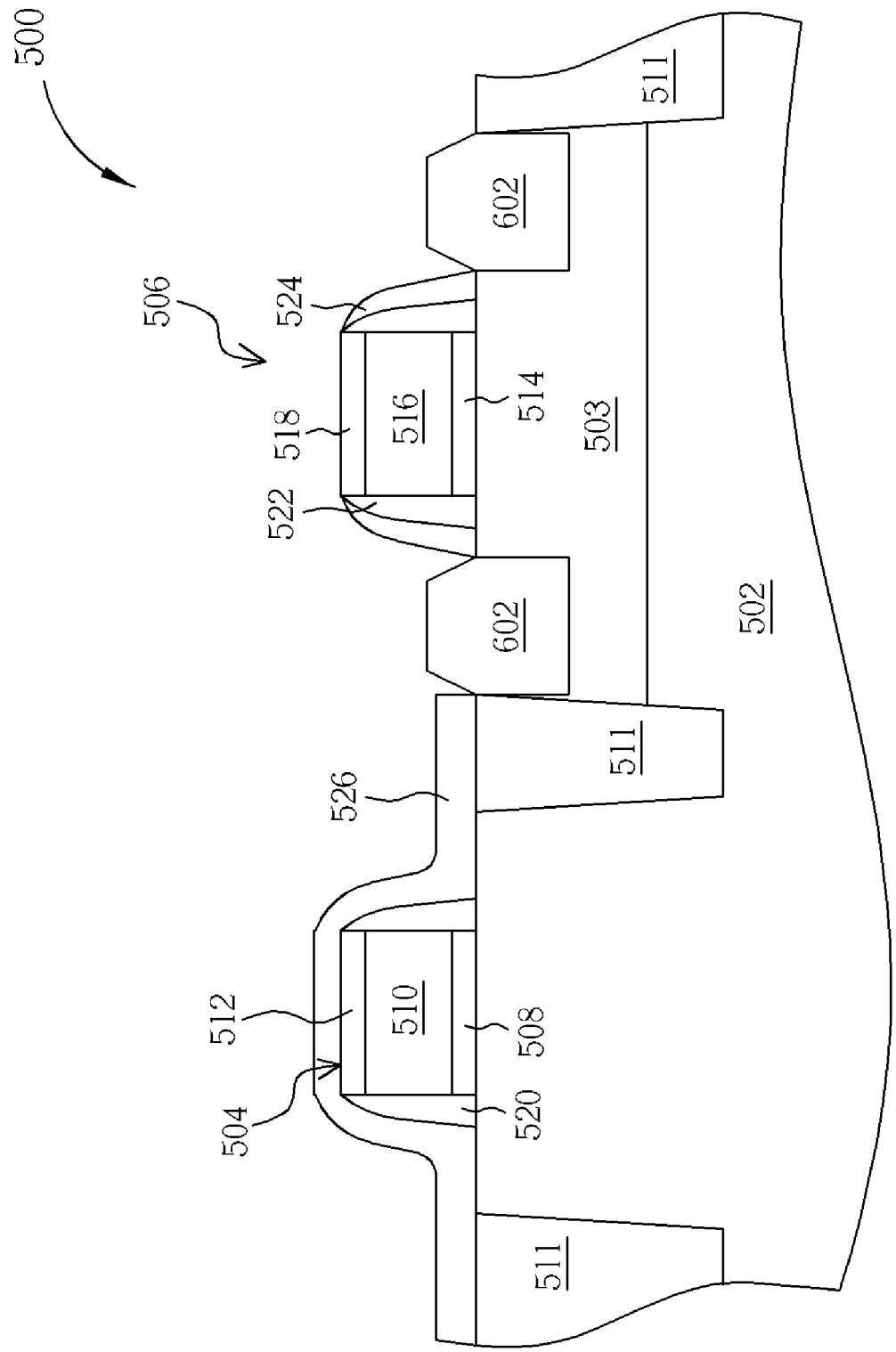

Please refer to FIG. 6. And then, a selective epitaxial growth (SEG) process is performed to form epitaxial layers 602 in the recesses 530. The epitaxial layers 602 are made from silicon, SiGe or SiC.

Figure 7:
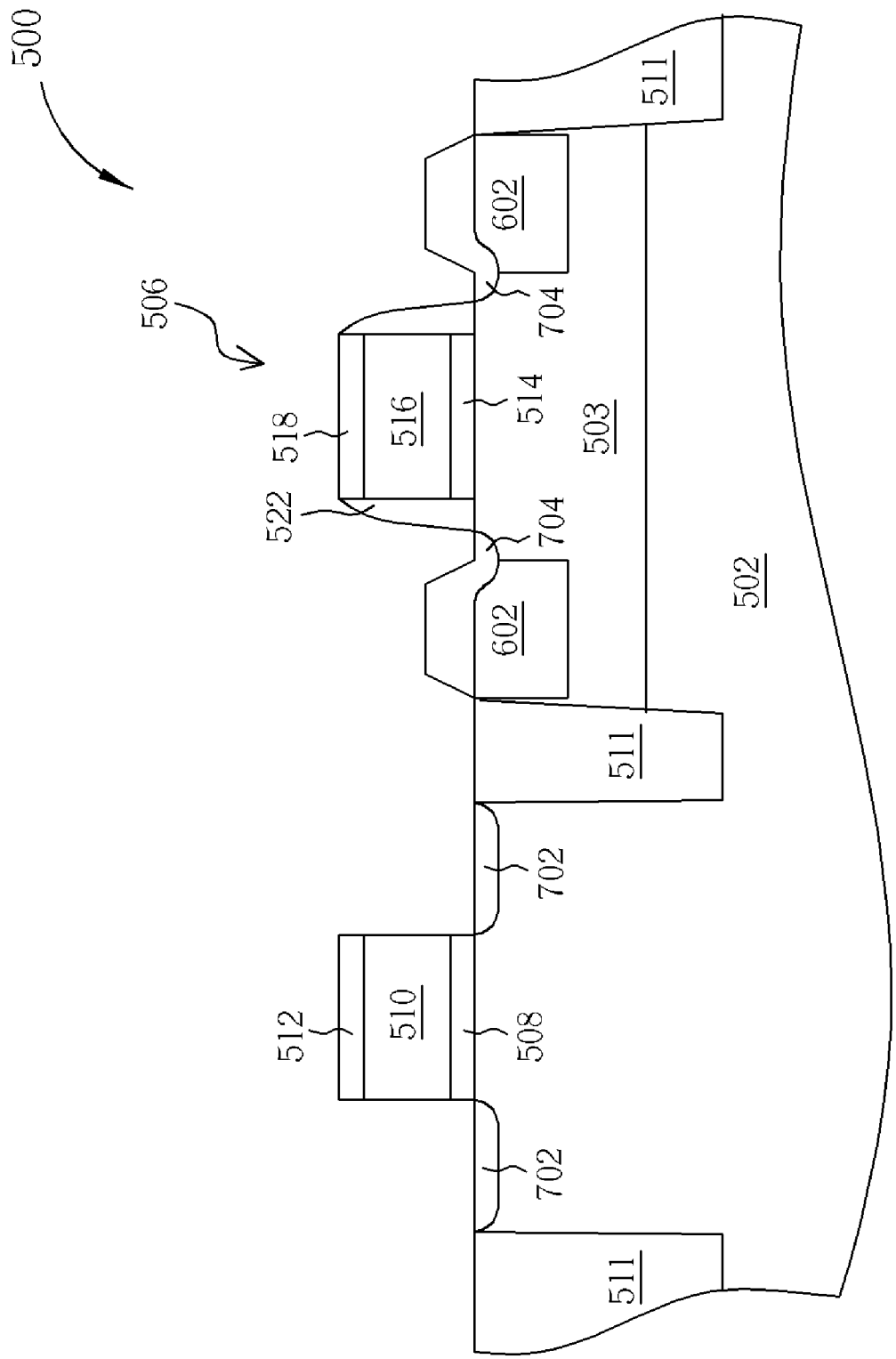

Please refer to FIG. 7. An etching process is performed, and the nitride silicon layer 526, the offset spacer 520, and the disposable spacer 524 are removed. Next, a mask (for example, a pattern photoresist layer) (not shown) is utilized to cover the gate 506 and the partial substrate 502. An ion implanting process and the laser anneal process are performed to form source/drain extension areas 702 in the substrate 502 of the two sides of the gate 502. Next, the mask on the gate 506 is removed, and another mask (for example a photoresist layer) (not shown) is formed to cover the gate 504 and partial substrate 502. An ion implanting process and a laser anneal process are performed to form source/drain extension areas 704 in the doped well 503 of the two sides of the gate 506, and the surface of the epitaxial layers 602. In the second embodiment, the source/drain extension areas 702 are N type LDDs, and the source/drain extension areas 704 are P type LDDs. Otherwise, the present invention isn't limited to the source/drain extension areas 702 being made firstly, and then forming the source/drain extension areas 704. In other variations, the source/drain extension areas 704 are made firstly, and then forms the source/drain extension areas 702.

Figure 8:
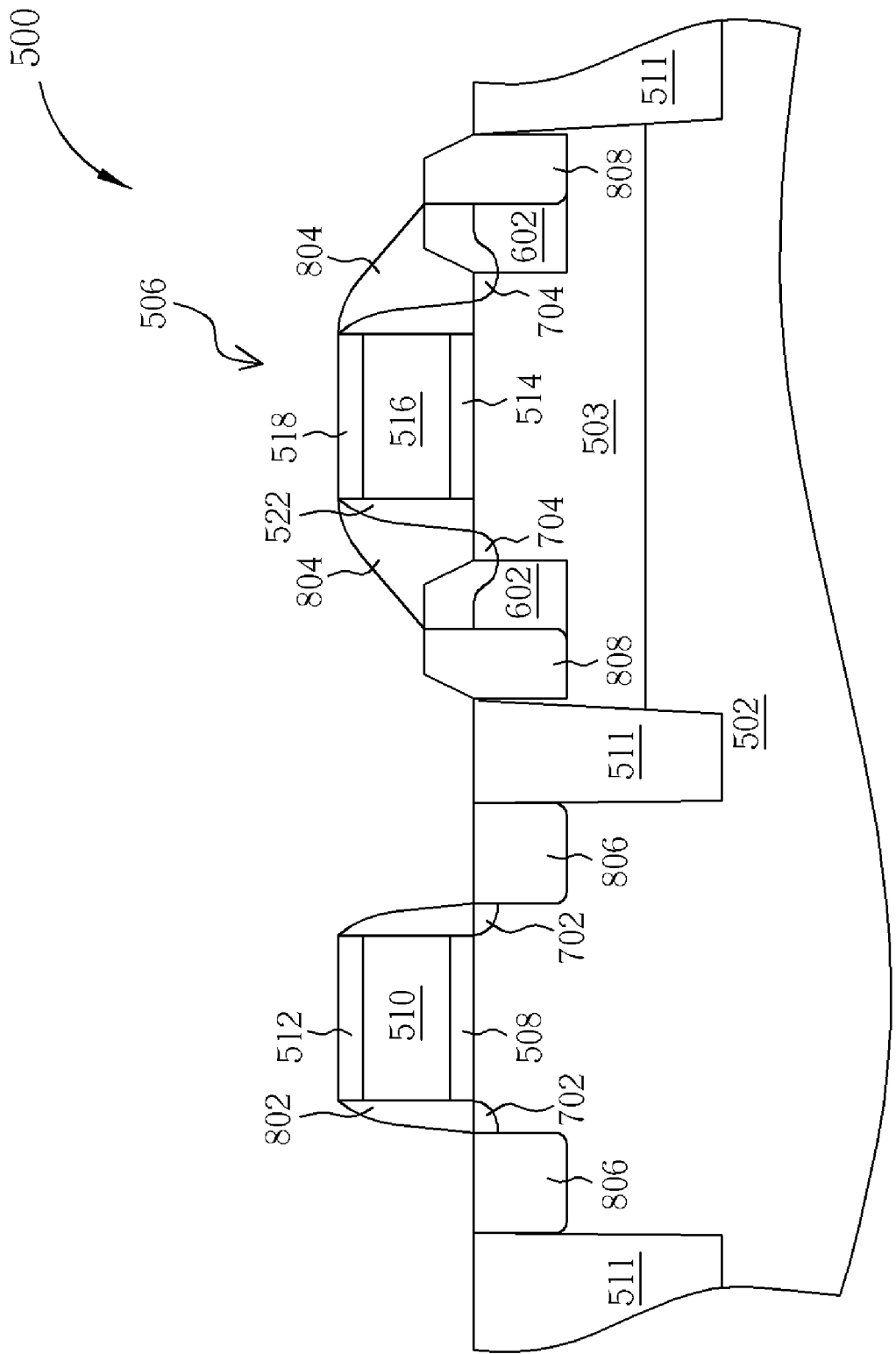

Please refer to FIG. 8. A nitride silicon layer (not shown) is on the substrate 502. An anisotropic etching process is performed to form a sub offset spacer 802 around the gate 504. A main spacer 804 is formed around the offset spacer 522 of the gate 506. Next, a mask (for example, a pattern photoresist layer) (not shown) is utilized to cover the gate 506 and the partial substrate 502. An ion implanting process and a laser anneal process are performed to form source/drain 806 in the substrate 502 outside the two sides of the offset spacer 802 of the gate 504. Subsequently, the mask on the gate 506 is removed, and another mask (for example, a pattern photoresist layer) (not shown) is formed to cover the gate 504 and the partial substrate 502. An ion implanting process and a laser anneal process are preformed to form source/drain 808 in the epitaxial layer 602 of the two sides of the main spacer 804 of the gate 506. The present invention isn't limited to the source/drain 806 being made firstly, and then forming the source/drain 808. In other variations, the source/drain 808 is made firstly, and then forms the source/drain 806. Subsequently, a self-aligned silicide process is performed to silicide (not shown) on the gates 504, 506, and the source/drain 806, 808. The gates 504, 506, and source/drain 806, 808 compose the complementary metal oxide semiconductor (CMOS) transistor.

In the second embodiment, the present invention isn't limited to the above method of manufacturing the source/drain 808. The present invention also can add dopant in the SEG process to form the epitaxial layer 602, and the doped epitaxial layer 602 as source/drain. Otherwise, the epitaxial layer 602 still has no dopant when the SEG process is performed, and an ion implanting process is performed to form doped epitaxial layer 602 as source/drain before the disposable spacer 524 is removed. The PMOS having the epitaxial layer in a CMOS is illustrated by the above manufacture. The present invention also suited for the NMOS having the epitaxial layer in a CMOS.

Figure 9:
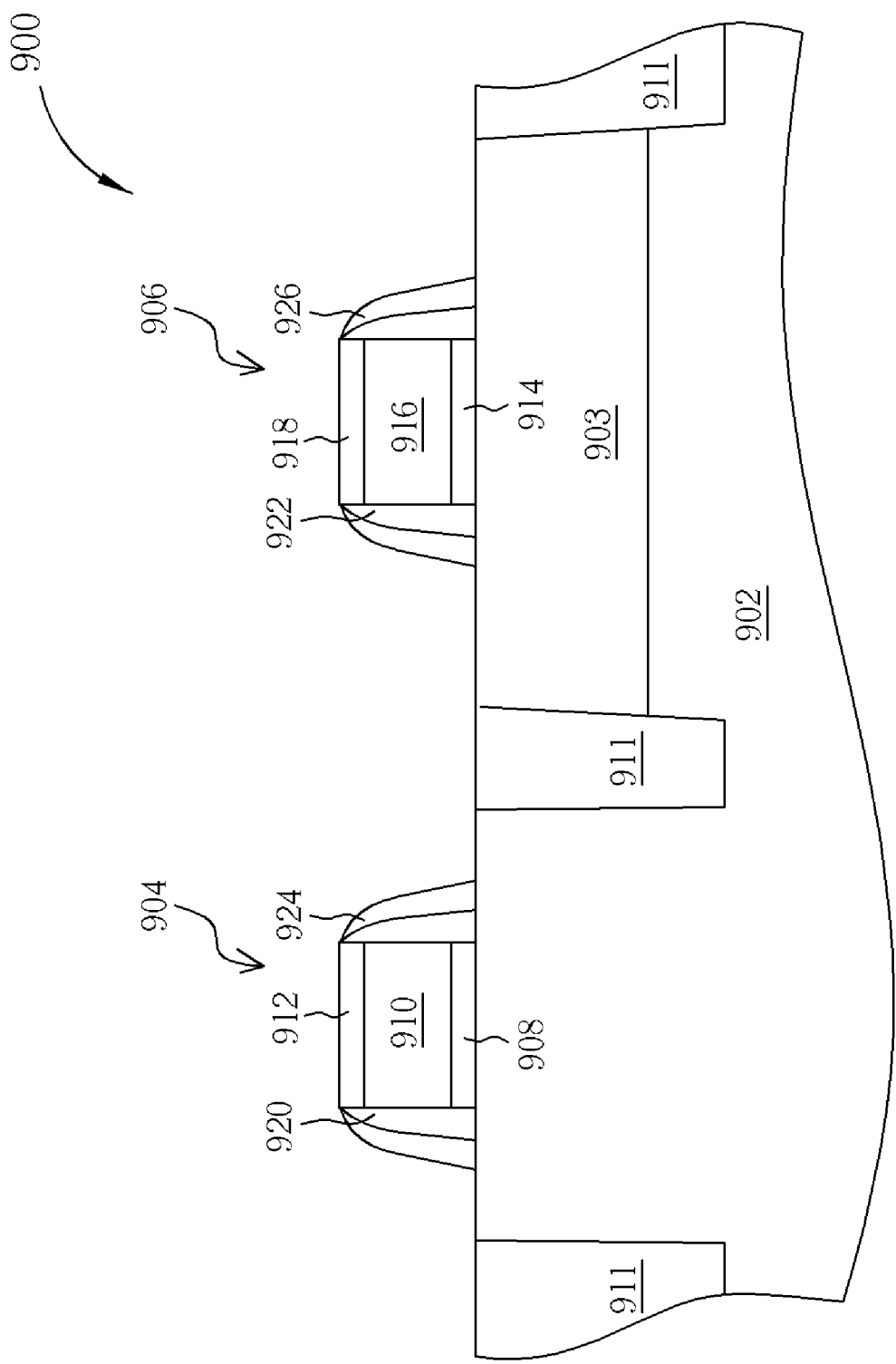
FIGS. 9 to 12 are schematic diagrams of a manufacturing method of a third embodiment in the present invention.
Figure 10:
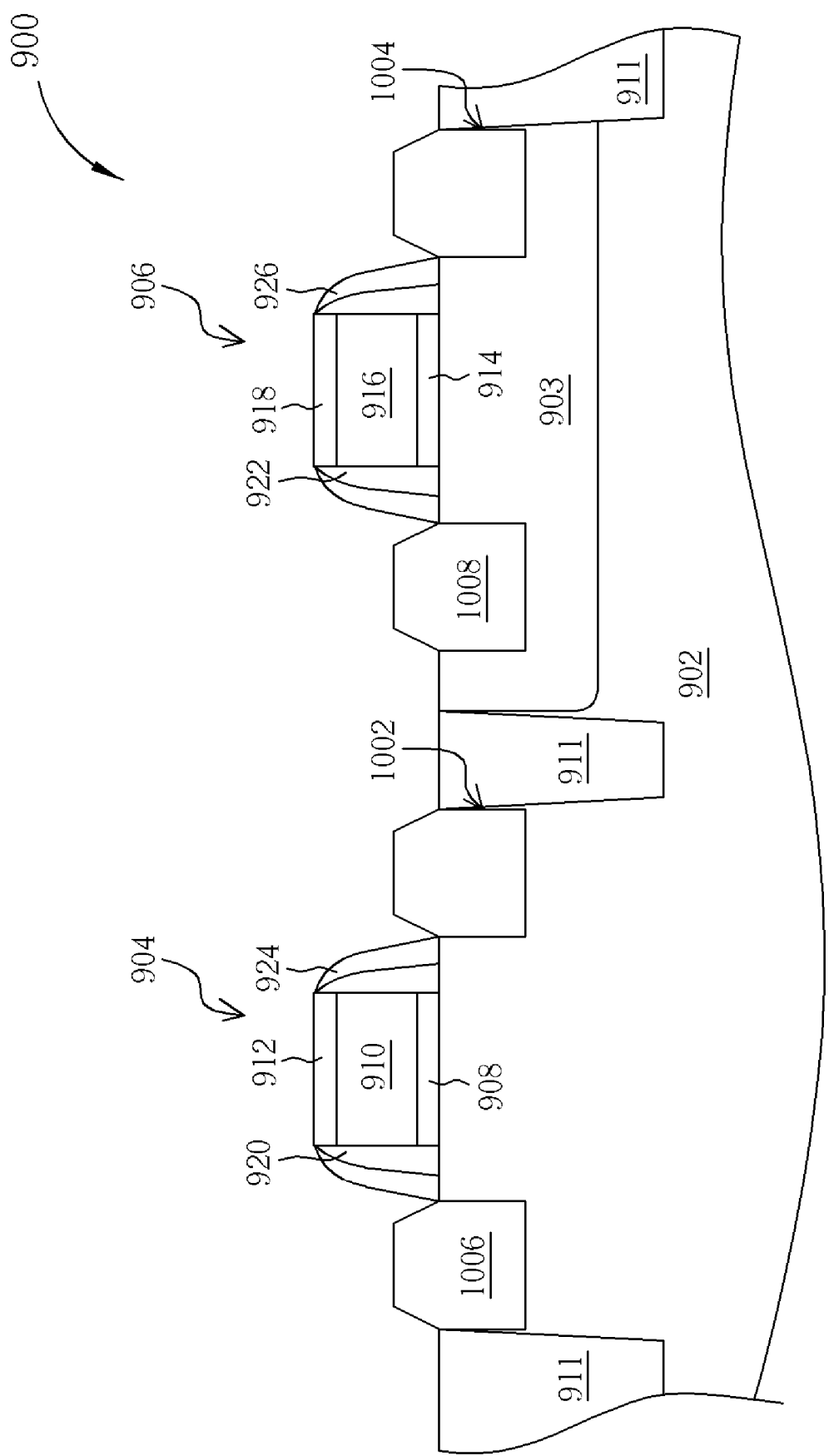

Please refer to FIGS. 9 to 12. FIGS. 9 to 12 are schematic diagrams of a manufacturing method of a third embodiment in the present invention. As FIG. 9 shows, a semiconductor wafer 900 has a substrate 902. The substrate 902 has a doped well 903. The doped well 903 is an N type well in the third embodiment. Gates 904, 906 are formed on the substrate 902, and a STI 911 is around the gates 904, 906, wherein the gate 906 is on the doped well 903. The gates 904, 906 include gate insulating layers 908, 914, doped poly-silicon layers 910, 916, and cap layers 912, 918.

A deposition process and an anisotropic etching process are performed to form offset spacers 920, 922 around the gates 904, 906. And then, a nitride silicon layer (not shown) is deposited on the substrate 902, and the gates 904, 906. And an anisotropic etching process is performed to form disposable spacers 924, 926 outside the offset spacers 920, 922 around the gates 904, 906. Please notice, the offset spacers 920, 922 and the disposable spacers 924, 926 are made by the different etching selectivity materials. Next, a SEG process is performed to form epitaxial layers 1006, 1008 in the recesses 1002, 1004. The epitaxial layers 1006, 1008 are made from silicon, SiGe or SiC.

Figure 11:
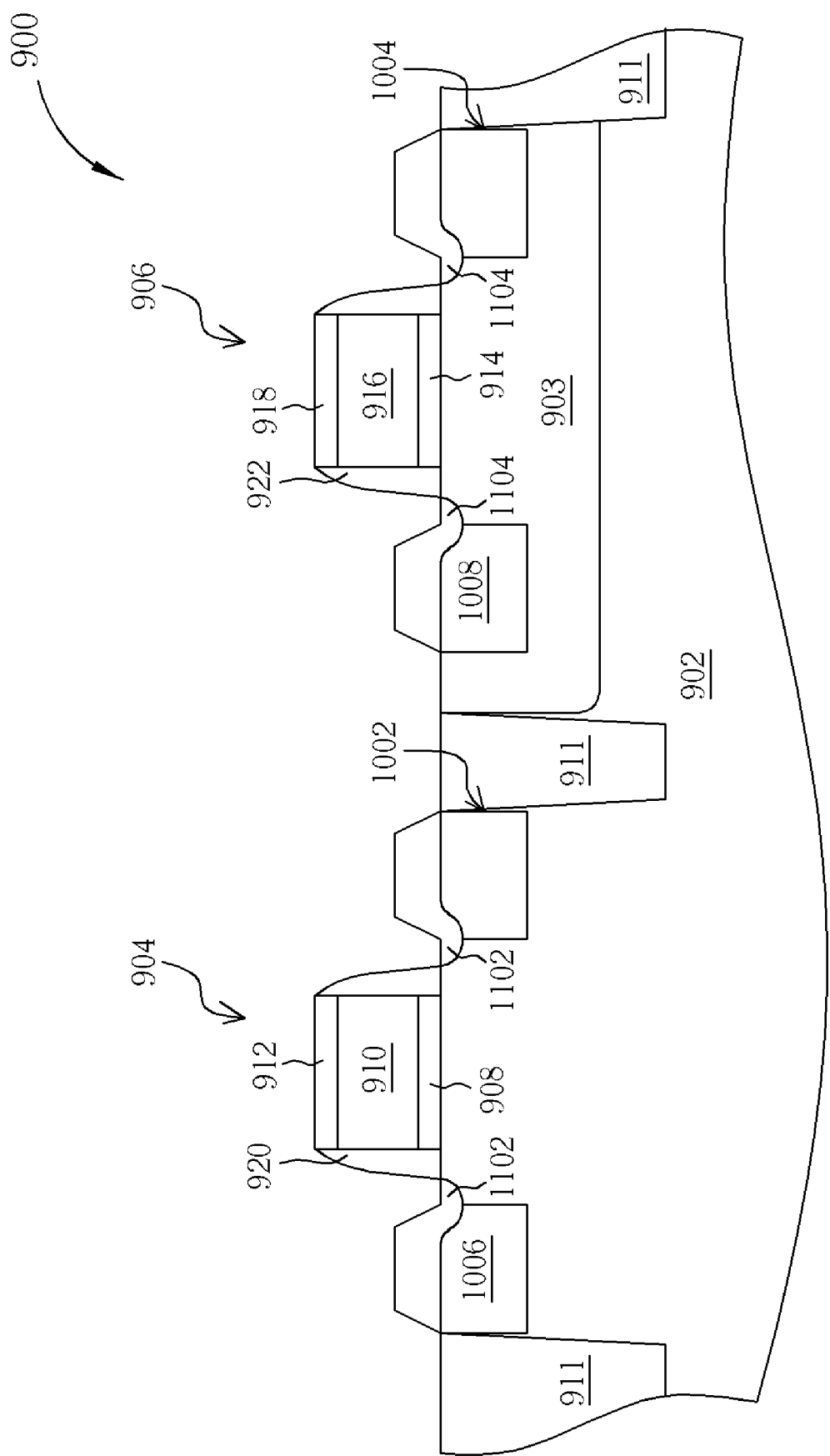

Please refer to FIG. 11. An etching process is performed, and the disposable spacers 924, 926 are removed. Next, a pattern photoresist layer (not shown) is formed on the gate 906 and the partial substrate 902. An ion implanting process and the laser anneal process are performed to form source/drain extension areas 1102 in the substrate 902 outside the offset spacer 920 of the two sides of the gate 904. Next, the above-mentioned photoresist layer is removed, and another pattern photoresist layer is formed to cover the gate 904 and partial substrate 902. An ion implanting process and a laser anneal process are performed to form source/drain extension areas 1104 in the doped well 903 outside the offset spacer 922 of the two sides of the gate 906, and the surface of the epitaxial layers 1008. In the third embodiment, the source/drain extension areas 1102 are N type LDDs, and the source/drain extension areas 1104 are P type LDDs. The sequence of forming the source/drain extension areas 1102, 1104 can be exchanged.

Figure 12:
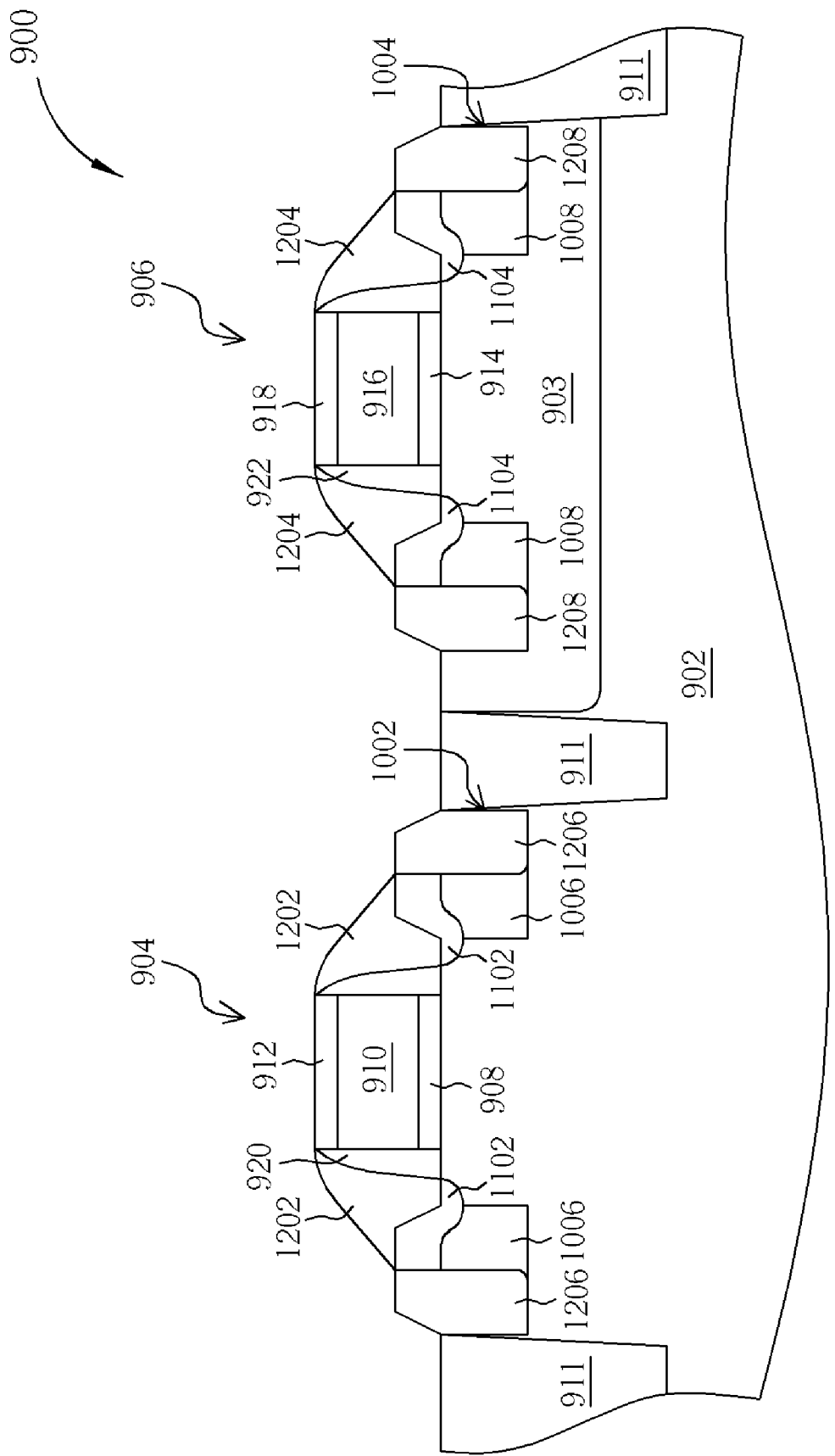

Please refer to FIG. 12. A nitride silicon layer (not shown) is on the substrate 902. An anisotropic etching process is performed to form main spacers 1202, 1204. Next, a pattern photoresist layer (not shown) is formed on the gate 906, and the partial substrate 902. An ion implanting process and a laser anneal process are performed to form source/drain 1206 in the epitaxial layers 1006 outside the two sides of the main spacer 1202 of the gate 904. Subsequently, the above pattern photoresist layer is removed, and another pattern photoresist layer (not shown) is formed to cover the gate 904 and the partial substrate 902. An ion implanting process and a laser anneal process are preformed to form source/drain 1208 in the epitaxial layer 1008 of the two sides of the main spacer 1204 of the gate 906. Subsequently, a self-aligned silicide process is performed to silicide (not shown) on the gates 904, 906, and the source/drain 1206, 1208. The gates 904, 906, and source/drain 1206, 1208 compose the CMOS transistor.

In the third embodiment, the present invention isn't limited to the above method of manufacturing the source/drain 1206, 1208. The present invention also can add dopant in the SEG process to form the epitaxial layers 1006, 1008, and the doped epitaxial layers 1006, 1008 as source/drain. Otherwise, the epitaxial layer 1006, 1008 still have no dopant when the SEG process is performed, and an ion implanting process is performed to form doped epitaxial layers 1006, 1008 as source/drain before the disposable spacers 924, 926 is removed. The present invention is not limited to the above method of manufacturing the etched recesses of the PMOS and the NMOS at the same time, the hard mask can change by demand when the SEG process is performed, and the recesses and the epitaxial layer of the PMOS and the NMOS can individually manufacture.

Please notice, in the above-mentioned embodiment, the materials of the substrate can be silicon, SOI, and/or compounds having Si, Ge, SiGe, and SiC. The gate insulating layer is made by materials having high-K, such as oxide, nitric oxide, nitride, silica, or hafnium silicates. The gate is not limited by the above poly-silicon, and it also can be made by dummy gate or any conductive material, such as metal. Besides, the disposable spacer, and the main spacer are made by OO, ON, OON, ONO, ONONO. The silicide is made by Ti, Co, Ni.

The source/drain extension areas of the present invention are made after the SEG process, so the high temperature of the SEG process doesn't damage the source/drain extension areas. The transistor made by the present invention has an ultra shallow junction and the epitaxial layer. The silicide and the substrate of the present invention don't contact each other, and the source/drain extension areas can be maintained.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method of manufacturing a complementary metal oxide semiconductor transistor, comprising:
   providing a substrate;
   forming a first gate and a second gate on the substrate and forming a first gate insulating layer disposed only between the substrate and the first gate, and a second gate insulating layer disposed only between the substrate and the second gate;
   forming a first offset spacer around the first gate;
   forming a second offset spacer around the second gate;
   forming a disposable spacer around the second offset spacer;
   forming two epitaxial layers on two sides of the second gate outside the disposable spacer, wherein the step of forming the epitaxial layers comprises:
   forming a pattern hard mask on the first gate and part of the substrate; and
   performing an etching process, and the pattern mask, the second gate and the disposable spacer being used as a mask to form two recesses on two sides of the second gate;
   removing the pattern hard mask; and
   performing a SEG process to form the epitaxial layers in the recesses;
   removing the first offset spacer and the disposable spacer;
   forming two first source/drain extension areas on two sides of the first gate; and
   forming two second source/drain extension areas in the substrate and in the epitaxial layers outside the second offset spacer of the second gate.

2. The method of claim 1, wherein the second offset spacer and the disposable spacer are made from different materials of different etching selectivities.

3. The method of claim 1, further comprising an ion implanting process to implant dopant into the epitaxial layers after the epitaxial layers are formed.

4. The method of claim 1, wherein a material comprising dopants is used in the SEG process.

5. The method of claim 1, further comprising the following steps after the first and second source/drain extension areas are formed:
   forming a main spacer outside the second offset spacer and on part of the epitaxial layers, and forming a sub offset spacer around the first gate;
   forming a first photoresist layer on the second gate and the substrate;
   performing a first ion implanting process to form two first sources/drains in the substrate and on two sides of the first gate;
   removing the first photoresist layer;
   forming a second photoresist layer on the first gate and the substrate;
   performing a second ion implanting process to form two second sources/drains in the epitaxial layers without covering the main spacer.

6. A method of manufacturing a complementary metal oxide semiconductor transistor, comprising:
   providing a substrate;

forming a first gate, and a second gate on the substrate and forming a first gate insulating layer disposed only between the substrate and the first gate, and a second gate insulating layer disposed only between the substrate and the second gate;

forming a first offset spacer around the first gate, and forming a second offset spacer around the second gate;

forming a first disposable spacer around the first offset spacer, and forming a second disposable spacer around the second offset spacer;

forming a plurality of epitaxial layers on two sides of the first gate and two sides of the second gate after the first offset spacer, the second offset spacer, the first disposable spacer and the second disposable spacer are formed, the epitaxial layers being outside the first and second disposable spacers;

removing first and second disposable spacers after the epitaxial layers are formed to expose flat surfaces of the substrate between the epitaxial layers of the first gate and the first offset spacer as well as flat surfaces of the substrate between the epitaxial layers of the second gate and the second offset spacer; and forming a plurality of first and second source/drain extension areas by an implantation process in the substrate of the flat surfaces, in the epitaxial layers and on two sides of the first and second gate.

7. The method of claim 6, wherein the step of forming the epitaxial layers comprises:

forming a pattern hard mask on the substrate;

performing an etching process and the pattern hard mask being etching mask to from a plurality of recesses in two sides of the first and second gate;

removing the pattern hard mask; and performing a SEG process to form the epitaxial layers in the recesses.

8. The method of claim 6, further comprising the following steps after the epitaxial layers are formed:

forming a first pattern photoresist layer on the second gate and part of the partial substrate;

performing a first ion implanting process to implant dopant into the epitaxial layers on two sides of the first gate; and removing the first pattern photoresist layer.

9. The method of claim 6, further comprising the following steps after the epitaxial layers are formed:

forming a second pattern photoresist layer on the first gate and part of the substrate; and performing a second ion implanting process to implant dopant in the epitaxial layers on two sides of the second gate.

10. The method of claim 6, wherein a material comprising dopants is used in the SEG process.

11. The method of claim 6, further comprising following steps after the first and second source/drain extension areas are formed:

forming a main spacer outside the first and second offset spacers and on part of the substrate;

forming a first photoresist layer on the second gate and part of the substrate;

performing a first ion implanting process to form a plurality of first sources/drains in the epitaxial layers without covering the main spacer;

removing the first photoresist layer;

forming a second photoresist layer on the first gate and part of the substrate; and performing a second ion implanting process to form a plurality of second sources/drains in the epitaxial layers without covering the main spacer.

* * * * *